United States Patent
Bae et al.

(10) Patent No.: US 7,888,717 B2
(45) Date of Patent: Feb. 15, 2011

(54) THIN FILM TRANSISTOR SUBSTRATE HAVING COLOR FILTER WITH REVERSE TAPER SHAPE

(75) Inventors: Ju-Han Bae, Suwon-si (KR); Jang-Kyum Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 114 days.

(21) Appl. No.: 12/255,993

(22) Filed: Oct. 22, 2008

(65) Prior Publication Data
US 2009/0236604 A1 Sep. 24, 2009

(30) Foreign Application Priority Data
Mar. 20, 2008 (KR) .................. 10-2008-0025997

(51) Int. Cl.
*H01L 27/15* (2006.01)
(52) U.S. Cl. .............................. 257/294; 257/E27.131; 257/E27.132
(58) Field of Classification Search .................. 257/294, 257/E27.131, E27.132
See application file for complete search history.

(56) References Cited

U.S. PATENT DOCUMENTS

| | | | | |
|---|---|---|---|---|
| 5,968,850 A * | 10/1999 | Jeong et al. | .................. | 438/754 |
| 6,407,782 B1 * | 6/2002 | Kim | ........................... | 349/106 |
| 6,912,024 B2 * | 6/2005 | Kim et al. | .................... | 349/106 |
| 7,169,653 B2 * | 1/2007 | Lee et al. | .................... | 438/149 |
| 2006/0071212 A1 * | 4/2006 | Song et al. | .................... | 257/59 |

* cited by examiner

*Primary Examiner*—Sue Purvis
*Assistant Examiner*—W. Wendy Kuo
(74) *Attorney, Agent, or Firm*—Innovation Counsel LLP

(57) ABSTRACT

A thin film transistor substrate includes a color filter layer and a gate line. The color filter layer has a reverse taper shape, which is used to pattern the gate line without a separate mask. Thus, the total number of masks used to manufacture the thin film transistor substrate can be reduced, thereby reducing the manufacturing cost and improving the productivity.

11 Claims, 17 Drawing Sheets

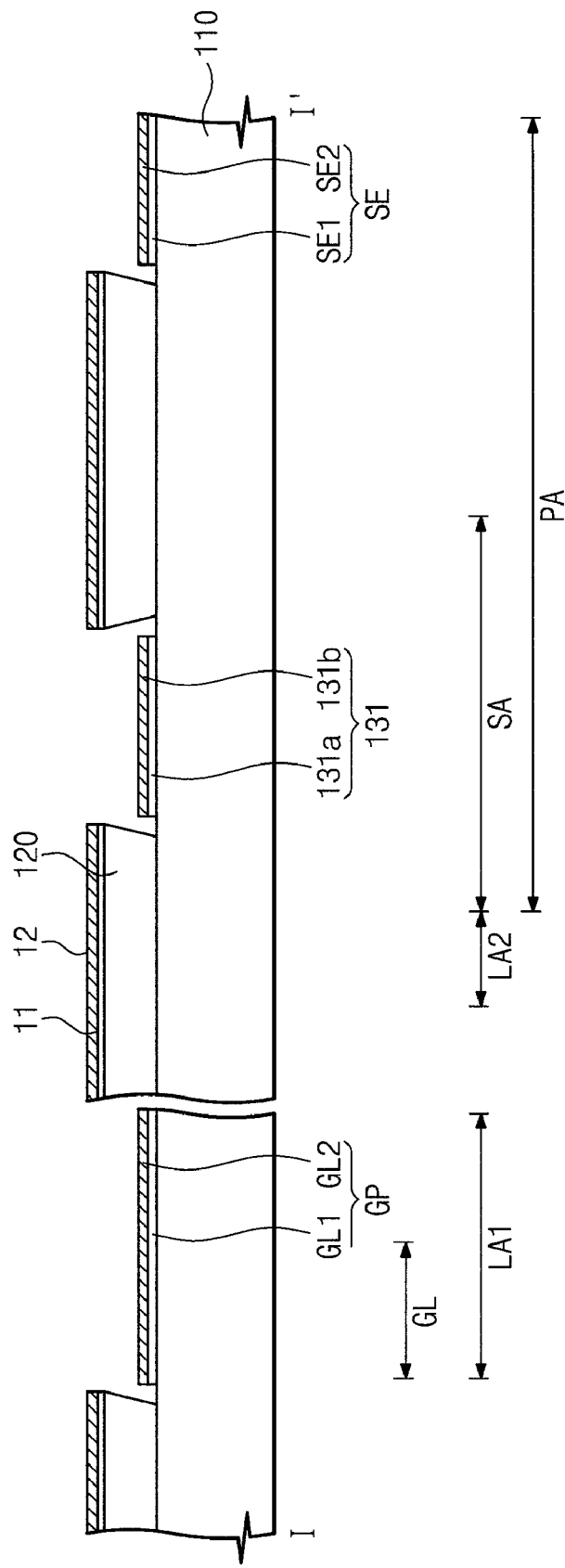

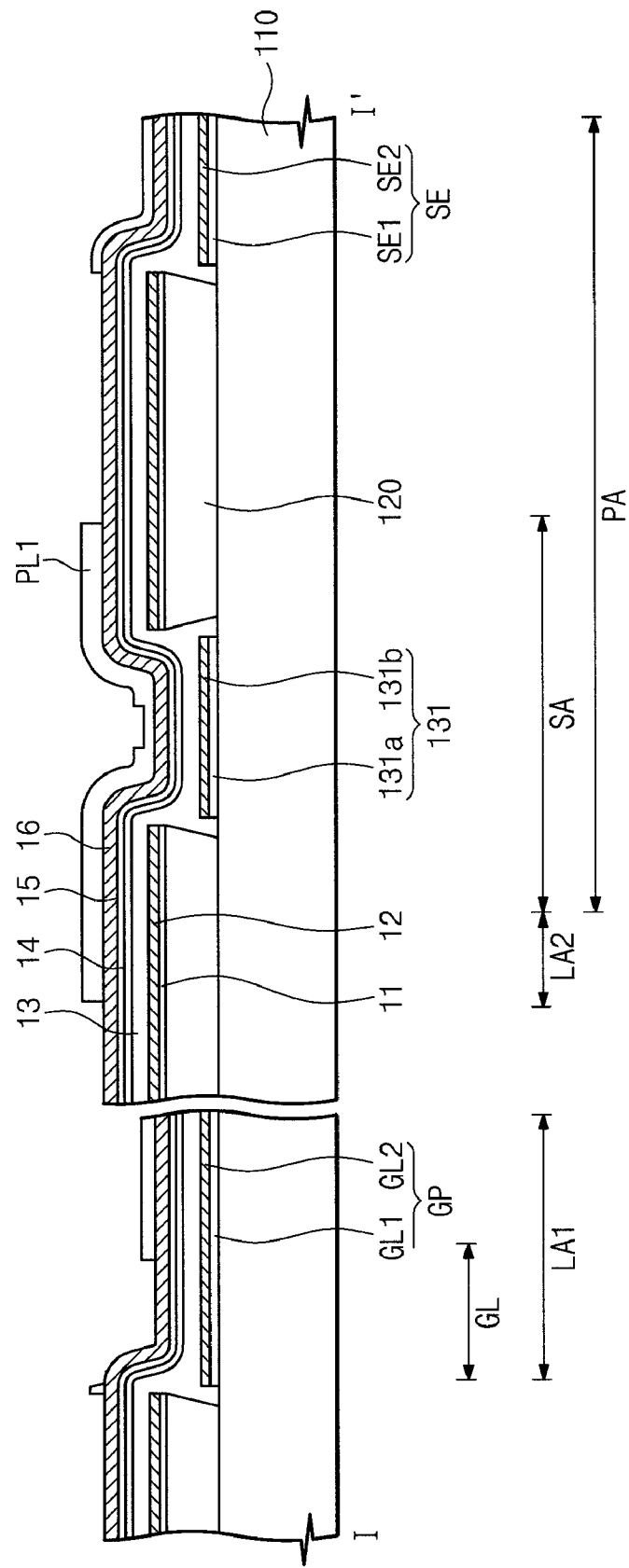

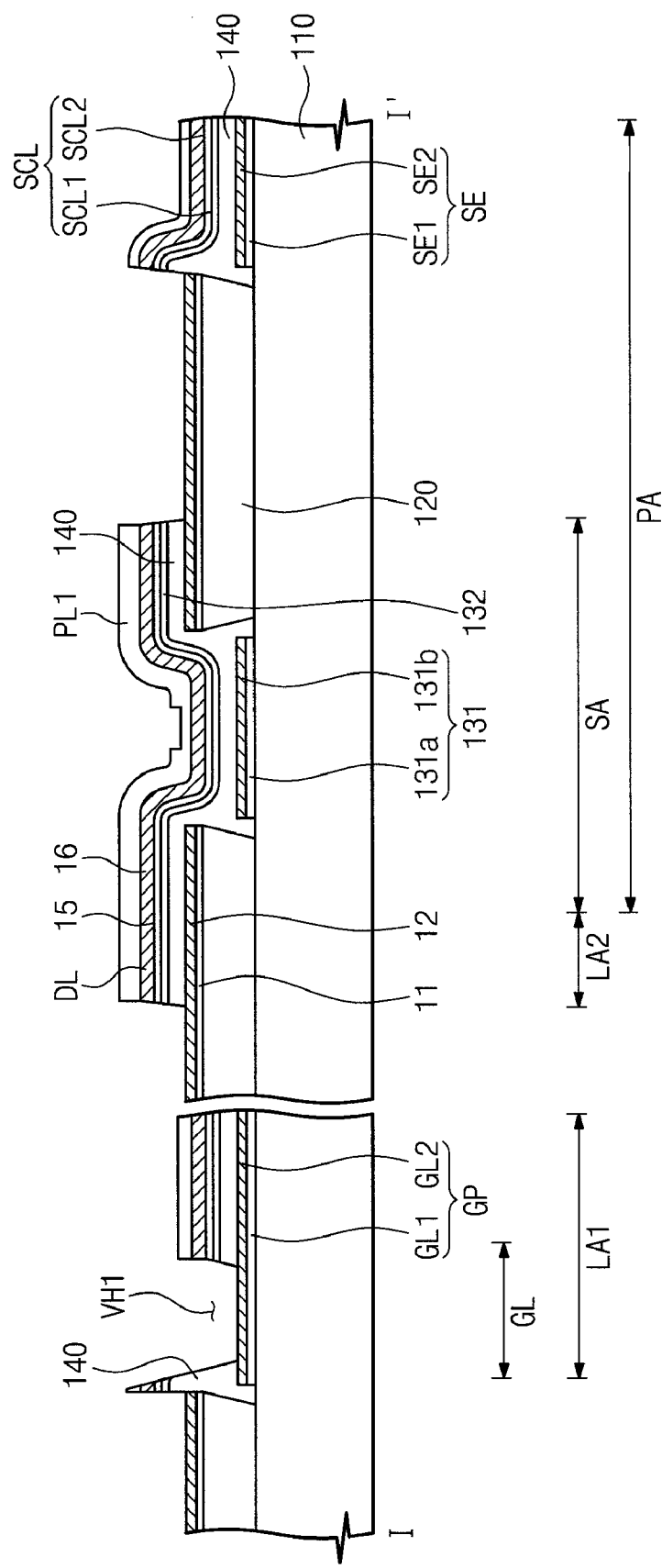

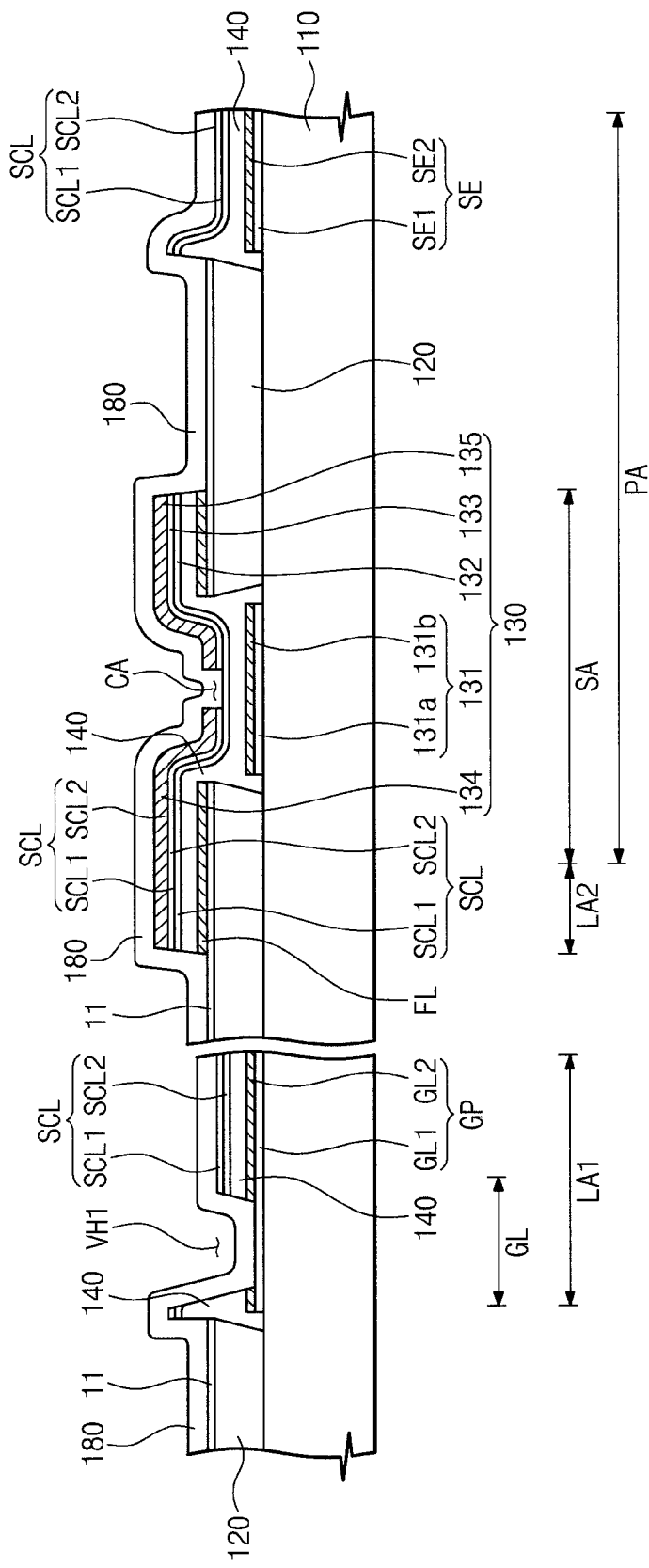

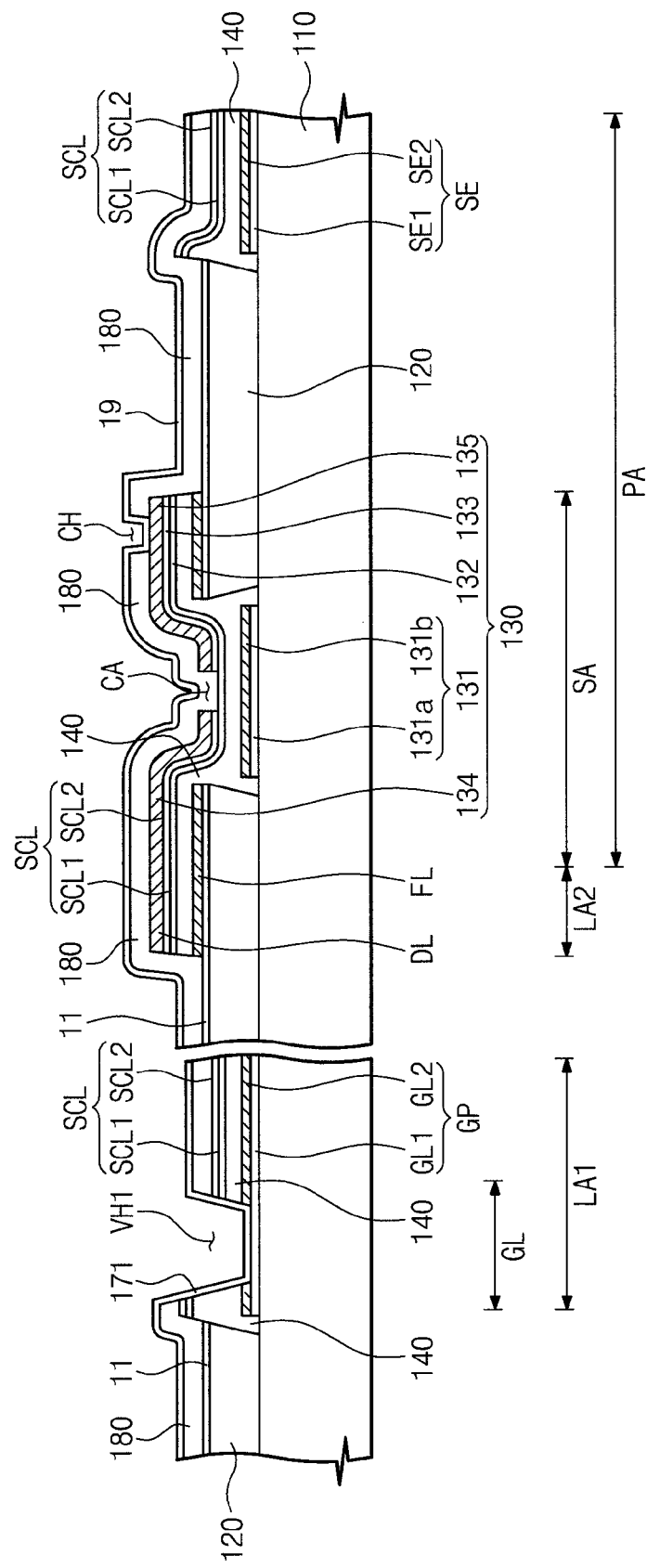

ium No. 2008-25997 filed on Mar. 20, 2008,
THIN FILM TRANSISTOR SUBSTRATE HAVING COLOR FILTER WITH REVERSE TAPER SHAPE

CROSS-REFERENCE TO RELATED APPLICATION

This application relies for priority upon South Korean Patent Application No. 2008-25997 filed on Mar. 20, 2008, the contents of which are herein incorporated by reference in its entirety.

BACKGROUND

1. Field of the Invention

The present invention relates to thin film transistor substrates with color filters (i.e. "color-filter-on-array" structures). Such substrates can be used in liquid crystal displays.

2. Description of the Related Art

In general, a liquid crystal display panel includes a thin film transistor substrate having thin films patterned by photolithographic processes using appropriate masks. It is generally desirable to reduce the total number of masks in order to reduce the manufacturing cost of the liquid crystal display panel.

In order to reduce the total number of masks, a manufacturing method has been proposed which uses a lift-off process. However, lift-off processes have a low process margin, so the product yield becomes low. Of note, the total number of masks is particularly high if the thin film transistor substrate is a color-filter-on-array structure because additional masks are needed to pattern the color filters, so reducing the total number of masks is particularly desirable for such structures.

SUMMARY

This section summarizes some aspects of the present invention. Other aspects are described in subsequent sections. The invention is defined by the appended claims.

Some embodiments of the present invention provide thin film transistor substrates which can be manufactured with fewer masks.

In an exemplary embodiment of the present invention, a thin film transistor substrate includes a base substrate, a color filter, a data line, a gate line, a thin film transistor, and a pixel electrode.

The base substrate includes a pixel area having a switching area, a first line area adjacent to the pixel area, and a second line area adjacent to the pixel area and intersecting the first line area. The color filter is present in the pixel area but absent from at least a part of the switching area and is present in the second line area. The color filter has a reverse taper shape. The gate line is arranged in the first line area and adjacent on all sides to the color filter layer. The data line is arranged in the second line area and overlies the color filter layer. The thin film transistor is arranged in the switching area and electrically connected to the gate line and the data line. The pixel electrode overlies the color filter and electrically connected to the thin film transistor.

The gate line includes a first gate line layer and a second gate line layer that is arranged on the first gate line layer. The first gate line layer is made from a different material than the data line, and the second gate line layer is made of the same material as the data line.

Some embodiments provide a method of manufacturing a thin film transistor substrate, the method comprising: forming a color filter layer having a reverse taper shape on a base substrate, the base substrate including a pixel area having a switching area, a first line area adjacent to the pixel area, a second line area adjacent to the pixel area and intersecting the first line area, wherein the color filter layer is present in the pixel area but not in at least a part of the switching area and is present in the second line area; forming a gate line and a thin film transistor's gate electrode using the reverse taper shape of the color filter; over the gate line, forming a first insulating layer, then a first semiconductor layer, and then a first conductive layer which is a metal layer; etching the first conductive layer, the first semiconductor layer, and the first insulating layer to form a gate insulating layer, source and drain electrodes, and a semiconductor layer which are part of the thin film transistor, and also to form a data line; and forming a pixel electrode in the pixel area of the base substrate.

According to one aspect of the present invention, the color filter layer has a reverse taper shape, and the gate line and the gate electrode are formed using the color filter layer as a mask. Thus, although the thin film transistor substrate includes the color filter layer, the total number of masks used to manufacture the thin film transistor substrate can be reduced, thereby reducing the manufacturing cost and improving the productivity.

BRIEF DESCRIPTION OF THE DRAWINGS

FIGS. 3A, 3B, 4A, 4B, and 5A to 5G are process views illustrating a method of manufacturing of the thin film transistor substrate of FIG. 1;

FIGS. 7A to 7C are views of vertical cross-sections of the thin film transistor substrate of FIG. 6 at different stages of fabrication according to some embodiments of the present invention.

DESCRIPTION OF SOME EMBODIMENTS

It will be understood that when an element or layer is referred to as being "on", "connected to" or "coupled to" another element or layer, then intervening elements or layers may or may not be present. In contrast, "directly on," "directly connected to" or "directly coupled to" means there are no intervening elements or layers. Like numbers refer to like elements throughout.

The terms "first", "second", etc. may be used herein as reference labels in describing various elements, components, regions, layers and/or sections. These terms are used to distinguish one element, component, region, layer or section from another and are not limiting. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein to describe relationships between elements as illustrated in the figures. It will be understood that the spatially relative terms are not intended to limit the spacial orientations of the device in use or operation to the orientation shown in the figures. For example, the device may be turned upside down, with elements described as "below" becoming oriented "above" other elements. The device may be oriented in any manner (e.g. rotated by 90 degrees or by other angles).

Some embodiments of the present invention will now be explained in detail with reference to the accompanying drawings.

Figure 1:
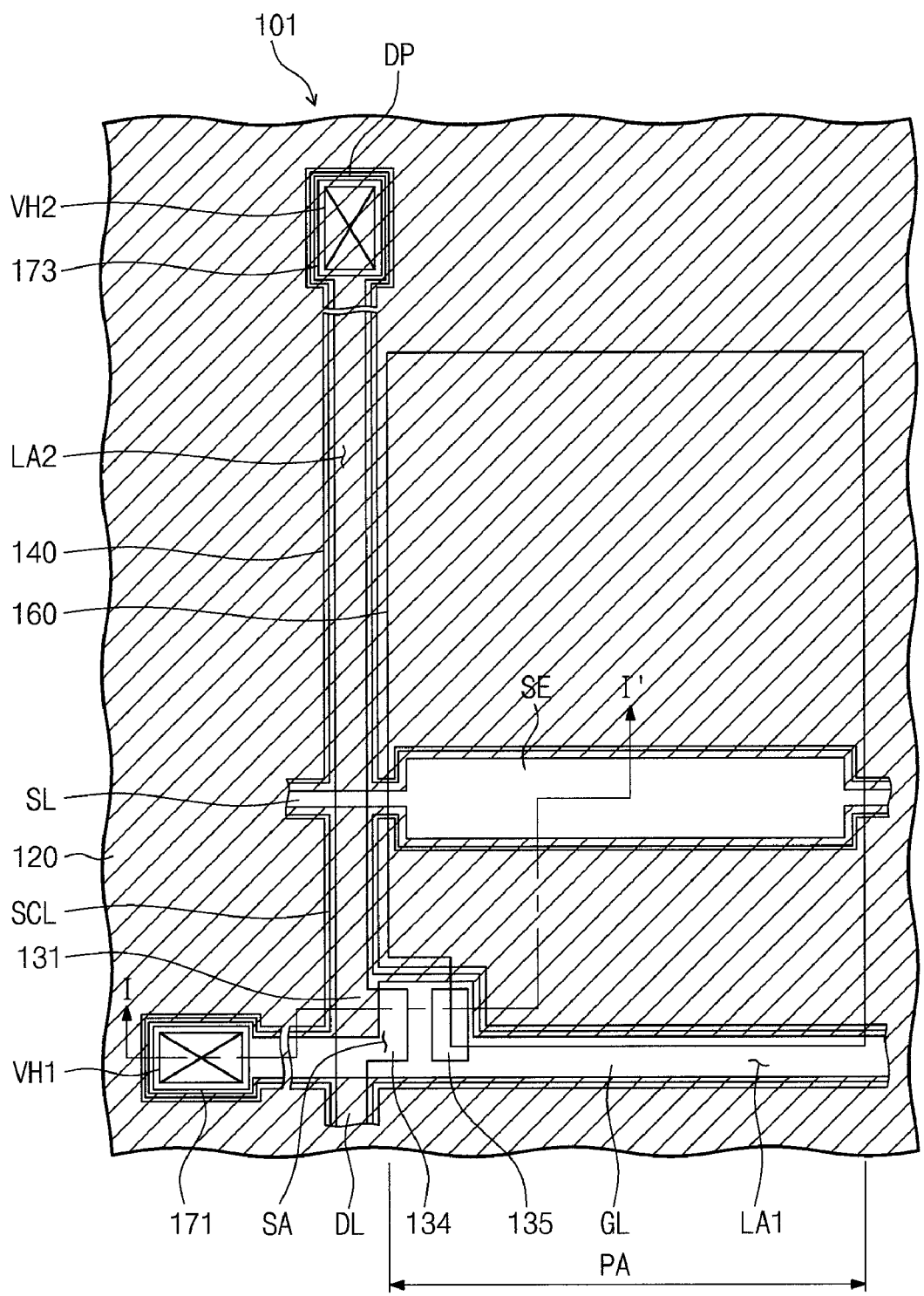
FIG. 1 is a plan view of a thin film transistor substrate according to some embodiments of the present invention.
Figure 2:
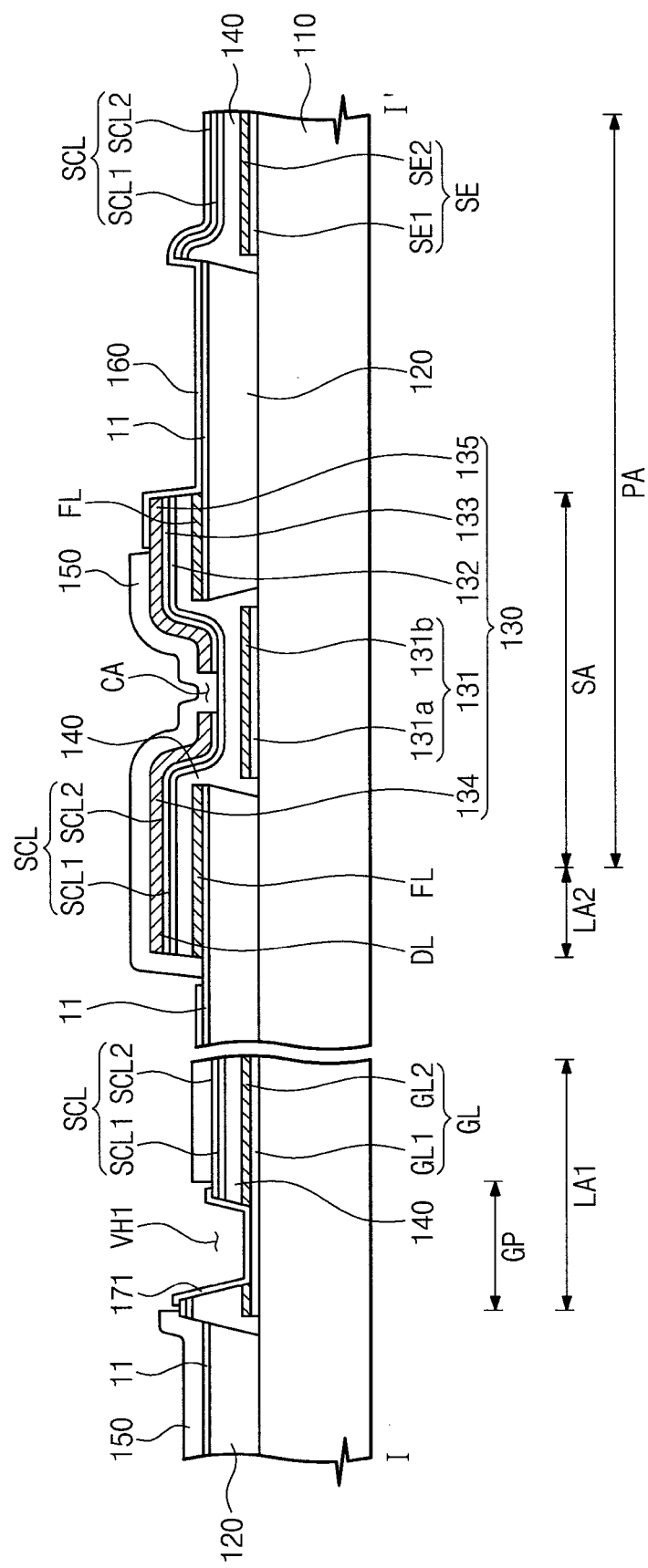
FIG. 2 is a view of the vertical cross-section taken along a line I-I' of FIG. 1.

FIG. 1 is a plan view of a thin film transistor substrate 101 according to some embodiments of the present invention, and FIG. 2 is a cross-sectional view taken along the line I-I' shown in FIG. 1.

The thin film transistor substrate 101 includes a base substrate 110, a color filter layer 120, a gate line GL, a data line DL, a thin film transistor 130, and a pixel electrode 160.

The base substrate 110 includes a pixel area PA having a switching area SA, a first line area LA1 and a second line area LA2. The area PA is adjacent to the first line area LA1 and the second line area LA2 intersecting the respective first line area LA1.

The color filter layer 120 is formed on the base substrate 110. The color filter layer 120 occupies almost the entire pixel area PA and almost the entire second line area LA2 but is absent from at least a part of each switching area SA. The color filter layer 120 has a reverse taper shape, its width gradually increasing from the bottom up. At each pixel, the color filter layer 120 has a predetermined color. In the present exemplary embodiment, the color filter layer 120 has a thickness of about 10000 angstroms to about 15000 angstroms.

The gate line GL is formed in the first line areas LA1 to transmit gate signals. The gate line GL includes a first gate line layer GL1 formed on the base substrate 110 and a second gate line layer GL2 formed on the first gate line layer GL1. The first and second gate line layers GL1 and GL2 may be formed of different materials. In some embodiments, the first gate line layer GL1 is formed of a transparent conductive material, for example indium tin oxide (ITO) or indium zinc oxide (IZO), and the second gate line layer GL2 is formed of a non-transparent metallic material. As explained below, the gate line GL is patterned by the color filter layer 120 during fabrication. The gate line GL may have a thickness of about 4000 angstroms to about 5000 angstroms.

The data line DL is formed in the second line area LA2 to transmit data signals. The data line DL overlies the color filter layer 120. The data line DL may be made of a different material than the first gate line layer GL1. In particular, the data line DL may be made of the same material as the second gate line layer GL2. In the present exemplary embodiment, the data line DL has a single-layer structure, but the data line DL may have a double-layer or triple-layer structure.

The thin film transistor 130 is formed in the switching area SA of the pixel area PA. The thin film transistor 130 is electrically connected to the gate line GL and the data line DL.

The thin film transistor 130 includes a gate electrode 131 branching off the gate line GL on the base substrate 110, and also includes an active layer 132 overlying the gate electrode 131. The active layer 132 is branched off a first semiconductor line SCL1 described below as part of a semiconductor line SCL. An ohmic contact layer 133 is formed on the active layer 132 and overlies the gate electrode 131. The ohmic contact layer is branched off a second semiconductor line SCL2 described below as part of a semiconductor line SCL. The active layer 132 have a thickness of about 500 angstroms to about 2500 angstroms, and the ohmic contact layer 133 have a thickness of about 600 angstroms to about 1400 angstroms. The thin film transistor 130 includes a source electrode 134 branching off the data line DL and a drain electrode 135 formed at the same layer as the source electrode. The source electrode 134 and the drain electrode 135 are formed on the ohmic contact layer 133.

The gate electrode 131 includes a first electrode layer 131a formed on the base substrate 110 and a second electrode layer 131b formed on the first electrode layer 131a. The first electrode layer 131a is formed together with the first gate line layer GL1 and of the same material as the first gate line layer GL1. The second gate electrode layer 131b is formed together with the second gate line layer GL2 and of the same material as the second gate line layer GL2. During fabrication, the gate electrode 131 is patterned without a separate mask by means of the reverse taper shape of the color filter layer 120. Therefore, the total number of masks needed to fabricate the thin film transistor substrate 101, and hence the manufacturing cost, are reduced.

The pixel electrode 160 is formed on the base substrate 110 after the thin film transistor 130. The pixel electrode 160 is formed in the pixel area PA and electrically connected to the drain electrode 135. The pixel electrode 160 overlaps the drain electrode 135 and the color filter layer 120. Thus, the pixel electrode 160 may be electrically connected to the drain electrode 135 without a contact hole, hence further reducing the total number of masks used to fabricate the thin film transistor substrate 101.

In the present exemplary embodiment, the pixel electrode 160 may be made of the same material as the first gate line layer GL1, for example of a transparent conductive material such as ITO, IZO or the like.

The thin film transistor substrate 101 may further include a gate insulating layer 140 and the semiconductor line SCL. The gate insulating layer 140 is formed on the base substrate 110 after the gate line GL and the gate electrode 131. The gate insulating layer 140 is present in the switching area SA, the first line area LA1, and the second line area LA2. The gate insulating layer 140 covers the gate electrode 131 and the gate line GL and underlies the data line DL. The gate insulating layer 140 has a thickness of about 1500 angstroms to about 2500 angstroms.

The semiconductor line SCL is formed on the gate insulating layer 140 in the first and second line areas LA1 and LA2 and patterned together with the data line DL. The semiconductor line SCL includes the first semiconductor line SCL1 and the second semiconductor line SCL2. The first semiconductor line SCL1 is formed on the gate insulating layer 140 and is in physical contact with the active layer 132. The first semiconductor line SCL1 is made of the same material as the active layers 132. The second semiconductor line SCL2 is formed on the first semiconductor line SCL1. The second semiconductor line SCL2 is made of the same material as the ohmic contact layer 133.

The gate line GL end in a gate pad GP to which gate signals are applied. The gate insulating layer 140 and the semiconductor line SCL are removed from over at least part of each gate pad GP in order to provide first via hole VH1 each of which exposes the gate pad GP. In the present exemplary embodiment, the second gate line layer GL2 is also removed from the gate pad GP, and thus the first gate line layer GL1 of the gate pad GP is exposed through the first via hole VH1.

Further, a first electrode pad 171 is arranged on the gate pad GP. The first electrode pad 171 is electrically connected to the first gate line layer GL1 of the gate pad GP through the first via hole VH1. The first electrode pad 171 is formed together with the pixel electrode 160 from the same material as the pixel electrode 160.

Similar to the gate line GL, the data line DL end in a data pad DP to which data signals are applied, and a second electrode pad 173 is formed on each data pad DP.

The thin film transistor substrate 101 may further include a protective layer 150. The protective layer 150 is formed on the base substrate 110 after the gate line GL, the data line DL, and the thin film transistor 130. The protective layer 150 is present on the gate insulating layer 140 in the first line area LA1 and on the data line DL in the second line area LA2. The protective layer 150 is present throughout the pixel area PA except for the area of the pixel electrode 160. The protective layer 150 partially covers the thin film transistor 130.

The protective layer 150 is removed from the first via hole VH1 not to cover the gate pad GP. Also, the protective layer 150 is removed from over a portion of each data pad DP to form a second via hole VH2 exposing the data pad DP. Each second electrode pad 173 is formed in the corresponding second via hole VH2 to contact the data pad DP.

The thin film transistor substrate 101 further includes a floating line FL. Each floating line FL is positioned between the gate insulating layer 140 and the color filter layer 120 in the second line area LA2 and the switching area SA (FIG. 2). The floating line FL is made of the same material as the second gate line layer GL2. The floating line FL is patterned together with the data line DL.

In addition, the thin film transistor substrate 101 further includes storage line SL and storage electrode SE for receiving a storage voltage. The storage line SL and the storage electrode SE are made of the same material as the gate line GL. The storage line SL and the storage electrode SE are formed together with the gate line GL from the same layer as the gate line GL. The storage electrode SE is formed as a widening of the storage line SL in the pixel area PA. Each storage electrode SE includes two layers SE1 and SE2. The gate insulating layer 140 is overlies the storage line SL and the storage electrode SE.

In the present exemplary embodiment, the first gate line layer GL1 are made from a first metal layer 11. Portions of the first metal layer 11 remain over the color filter layer 120 in the final structure.

Now a method of manufacturing the thin film transistor substrate 101 will be described in detail with reference to FIGS. 3A to 5G, which illustrate a method of manufacturing of the thin film transistor substrate 101 at different stages of fabrication.

Figure 3A:
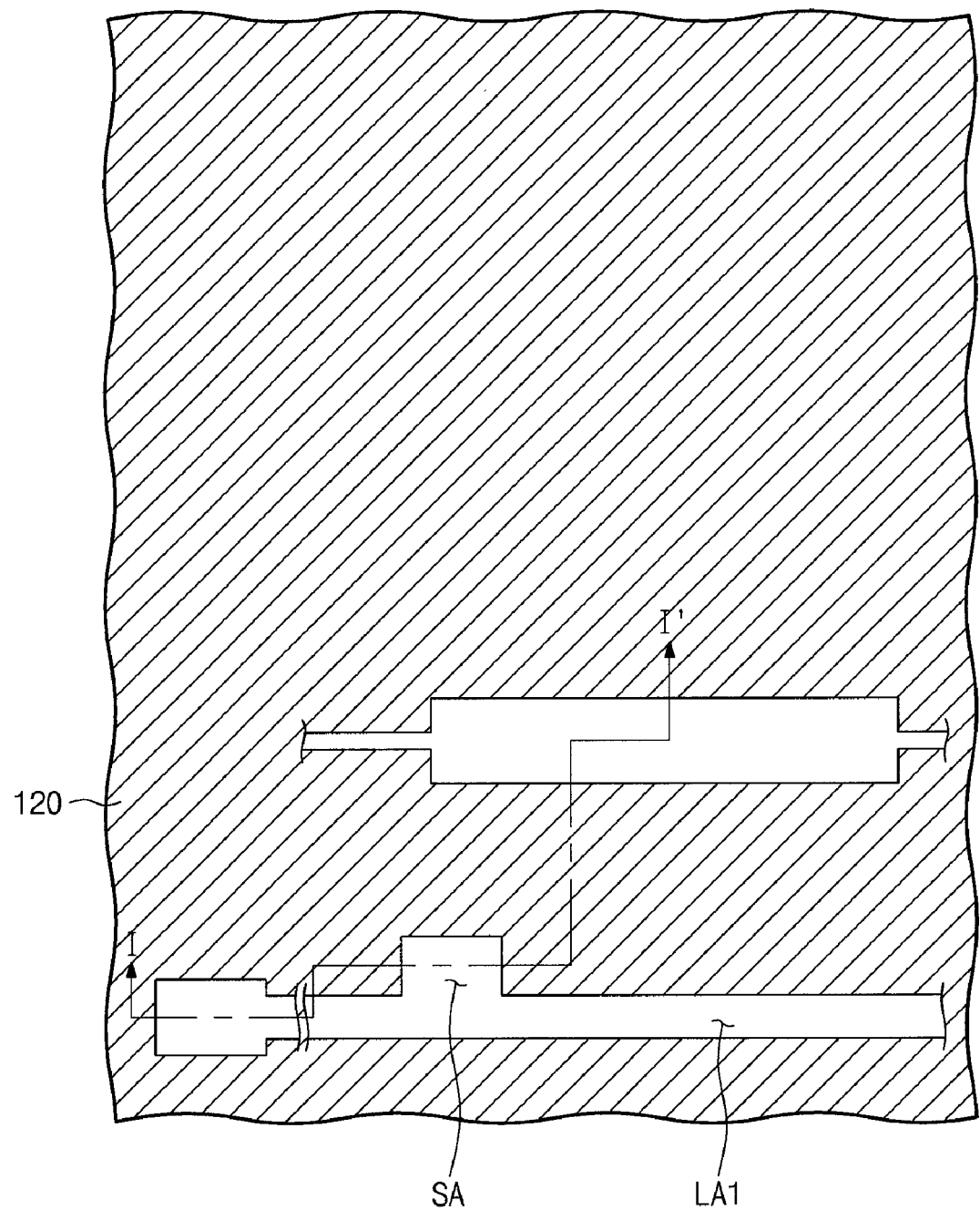
Figure 3B:
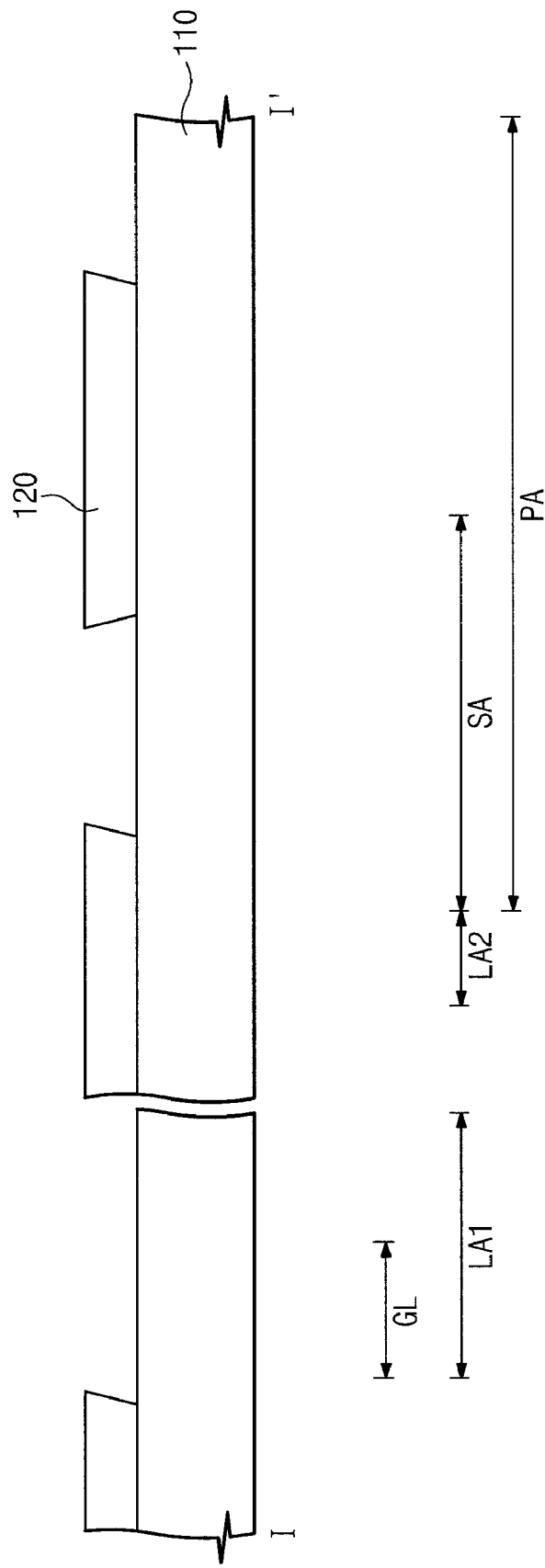

Referring to FIGS. 3A and 3B, the color filter layer 120 having a predetermined pattern of colors is formed on the base substrate 110 and is patterned to have the reverse taper shape. In the patterning operation, the color filter layer 120 is removed from at least parts of the first line area LA1 and the switching area SA. The color filter layer 120 may also be removed from at least parts of areas to be occupied by the storage line SL and the storage electrode SE.

Figure 4A:
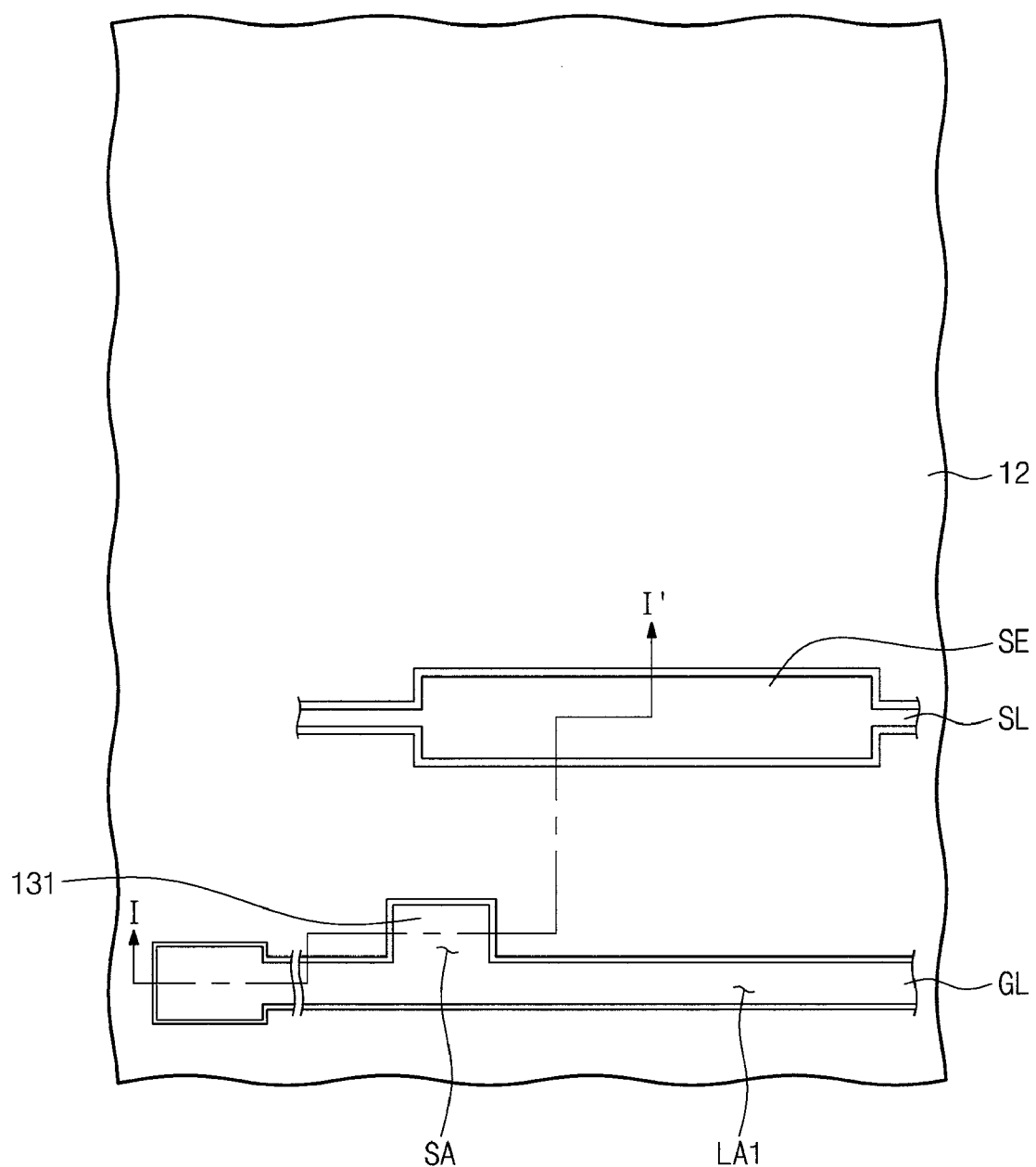

Referring to FIGS. 4A and 4B, first and second metal layers 11 and 12 of respective different materials are formed, in that order, on the base substrate 110 after the patterning of the color filter layer 120. In the present exemplary embodiment, the first metal layer 11 may be a transparent metallic material and the second metal layer 12 may be a non-transparent metallic material.

Due to the reverse taper of the color filter layer 120, those portions of the first and second metal layers 11 and 12 which lie above the color filter layer 120 are spaced (and electrically insulated) from those portions of the first and second metal layers 11 and 12 which lie in the areas from which the color filter layer 120 has been removed. These latter portions provide the gate line GL and the gate electrode 131, and possibly the storage line SL and the storage electrode SE. In particular, the gate line GL is formed in the respective first line area LA1 and the gate electrode 131 is formed in the respective switching areas SA. A separate mask is not needed to define the gate line GL and the gate electrode 131. Consequently, the total number of masks may be reduced, thereby reducing the manufacturing cost and improving the productivity.

Figure 5A:
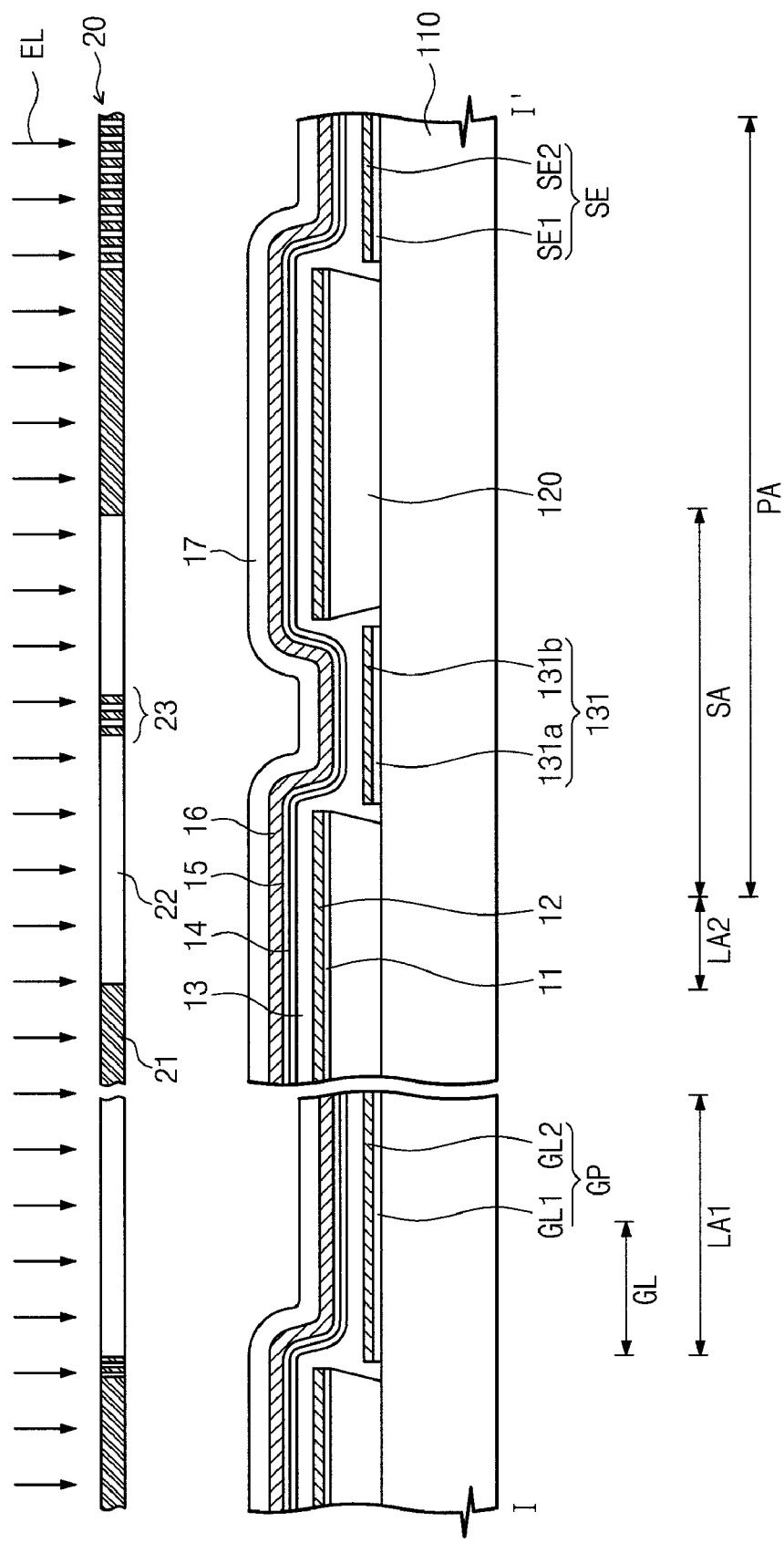

Referring to FIGS. 5A and 5B, an insulating layer 13 (which will provide the gate insulating layer 140), first and second semiconductor layers 14 and 15 (which will provide the first and second semiconductor lines SCL1 and SCL2), and a third metal layer 16 (which will provide the source and drain electrodes 134 and 135 and the data line DL) are formed, in that order, on the base substrate 110 after the gate line GL. The third metal layer 16 may be made of the same material as the second metal layer 12.

Then a first photoresist layer 17 is formed on the third metal layer 16. The first photoresist layer 17 is patterned photolithographically to provide a first masking layer PL1 of photoresist on the third metal layer 16. The patterning involves illuminating the photoresist layer 17 with light EL through a first optical mask 20 disposed above the first photoresist layer 17. The first optical mask 20 includes opaque areas 21 blocking the light EL, clear areas 22 transmitting the light EL, and slit areas 23 occupied by clear slits separated by opaque lines. One slit area 23 is disposed over a channel area CA (FIG. 2) of the thin film transistor 130 to define the channel area CA. In addition, one slit area 23 is partly provided over the first line area LA1. Also, if the thin film transistor substrate 101 is to include the storage lines SL and the storage electrodes SE, then slit areas 23 are provided in regions corresponding to the storage line SL and the storage electrode SE.

Next the first photoresist layer 17 is developed to remove the photoresist from the regions facing to the opaque areas 22 and to thin the photoresist in the regions facing to the slit areas 23. The first masking layer PL1 is formed as a result. The first masking layer PL1 is present in the first and second line areas LA1 and LA2 and the switching areas SA. The first masking layer PL1 is thinner in the regions exposed through the slit areas 23 than elsewhere. This process assumes positive photoresist for the layer 17. In other embodiments, negative photoresist is used instead, and the opaque and clear areas are interchanged (i.e. areas 22 are made opaque and areas 21 are made clear).

Referring to FIG. 5C, the first and second semiconductor layers 14 and 15 and the third metal layer 16 are patterned by a first etching process using the first masking layer PL1 as a mask. The first etching process etches the third metal layer 16 to partially pattern the source electrode 134 and the drain electrode 135 and to form the data line DL. The first etching process etches the second semiconductor layer 15 to partially pattern the ohmic contact layer 133 and to form the second semiconductor line SCL2. The first etching process etches the first semiconductor layer 14 to form the first semiconductor line SCL1 and the active layer 132. The first etching process etches the insulating layer 13 to pattern the gate insulating layer 140. The first etching process forms the first via hole VH1 over the gate pad GP of the gate line GL.

Figure 5D:
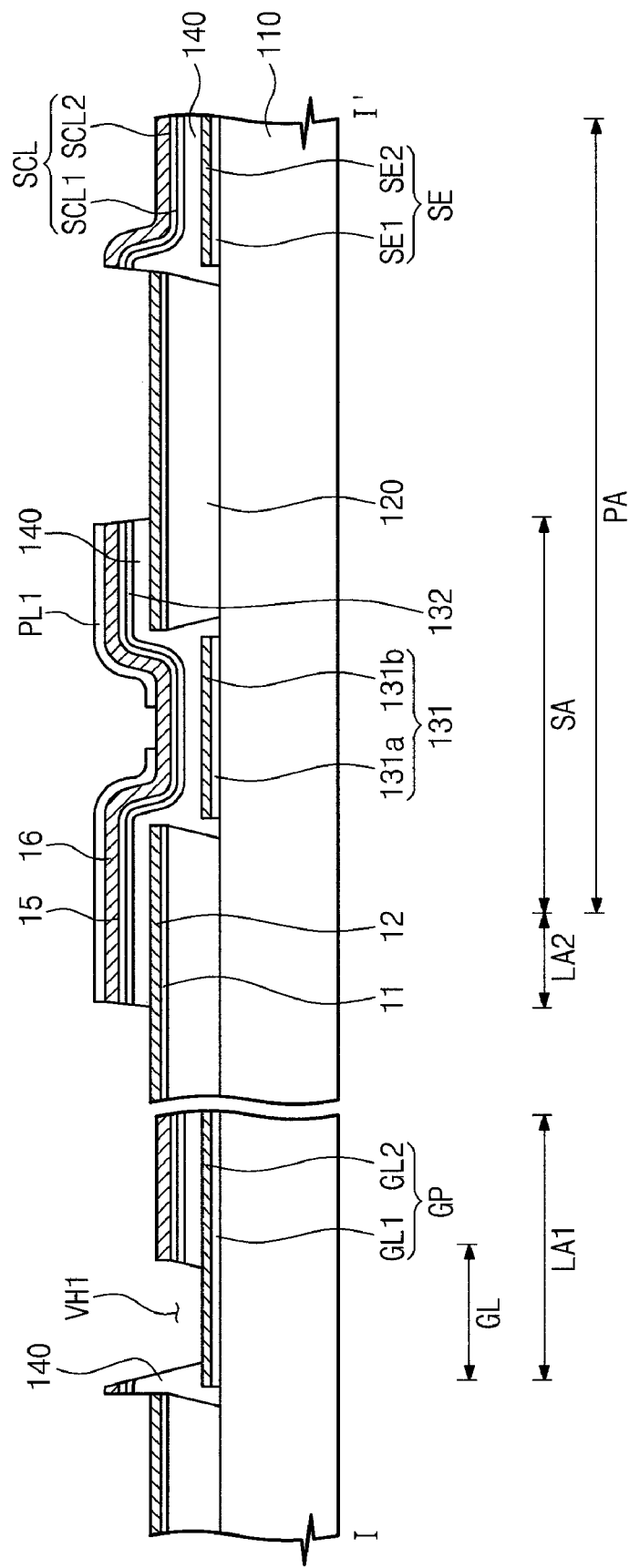

Then, as shown in FIG. 5D, the first masking layer PL1 is thinned by an etch exposing the third metal layer 16 in the channel area CA and the first line area LA1.

Figure 5E:
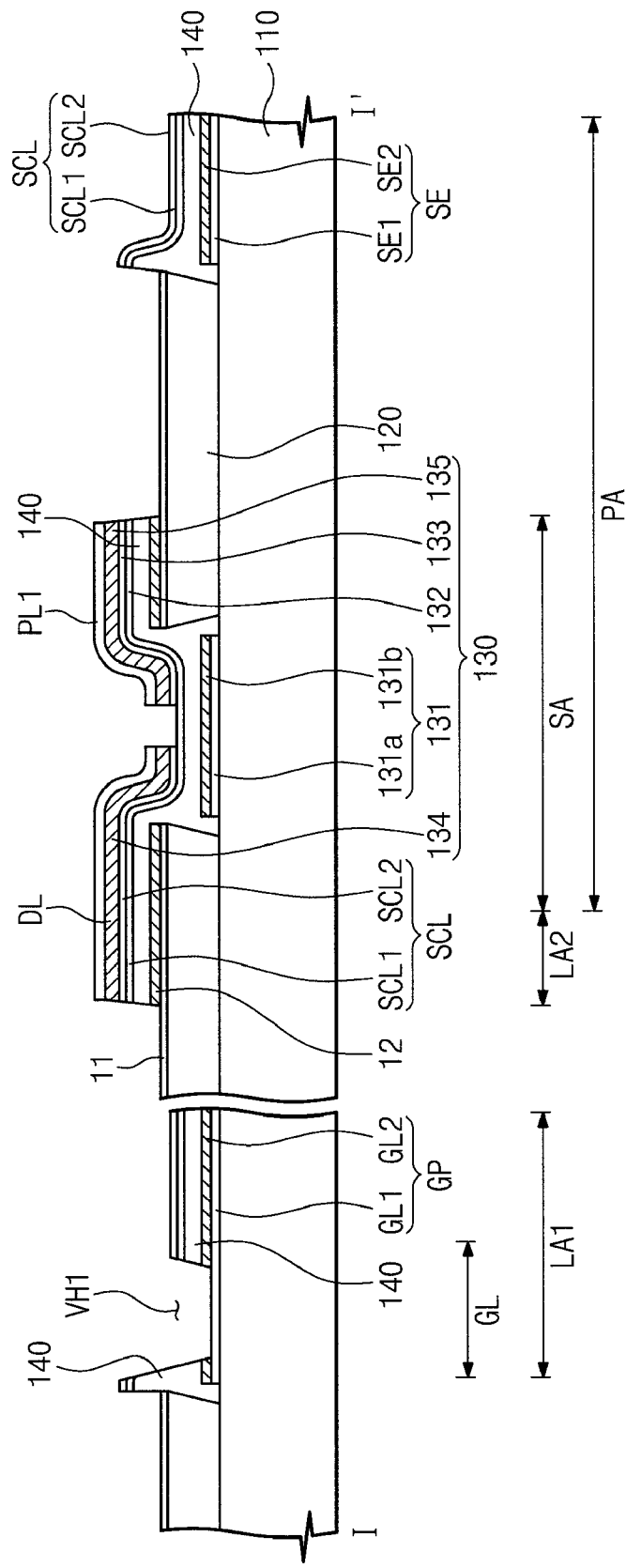

Next, as shown in FIG. 5E, a second etching process is performed using the thinned first masking layer PL1 as a mask, to remove the metal layer 16 in the channel area CA and the first line area LA1. The second etching process thus completes the patterning of the source electrode 134 and the drain electrode 135. In addition, the second etching process removes the exposed portions of the second metal layer 12 over the color filter layer 120 to form the floating line FL under the data line DL. The second etching process also removes a portion of the second gate line layer GL2 that is exposed through the first via hole VH1. As a result, the first gate line layer GL1 of the gate pad GP becomes exposed. The first metal layer 11 on the color filter layer 120 is not removed by the second etching process.

After the patterning of the source electrode 134 and the drain electrode 135, a portion of the second semiconductor layer 15 that are exposed in the channel area CA are removed to complete the patterning of the ohmic contact layer 133. Then the first masking layer PL1 is removed.

Figure 5F:
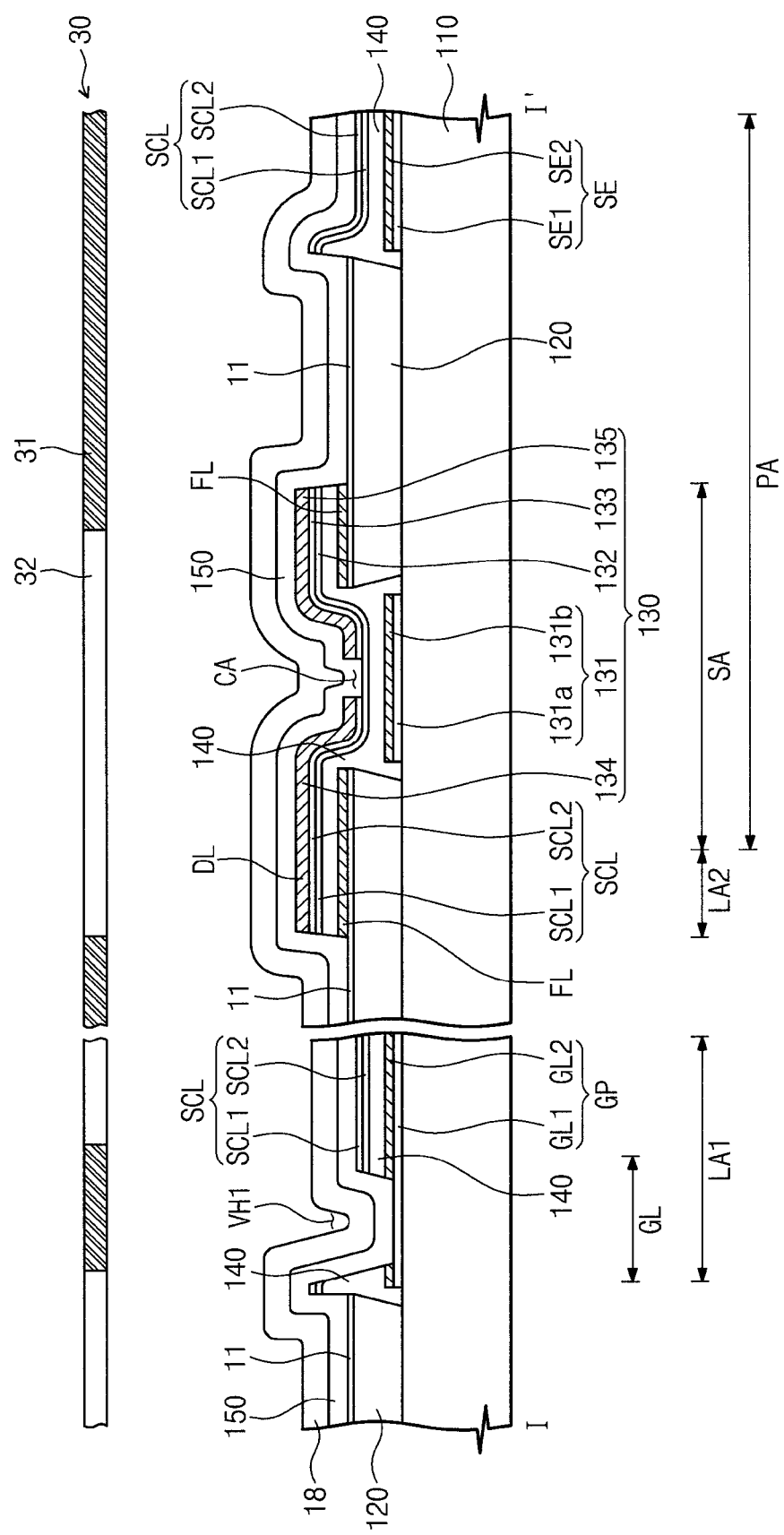

Referring to FIGS. 5F and 5C; the protective layer 150 and a second photoresist layer 18 are formed, in that order, on the base substrate 110 over the thin film transistor 130, and a second optical mask 30 is disposed above the second photoresist layer 18.

The second photoresist layer 18 is patterned using the second optical mask 30 to form a second masking layer PL2. The present exemplary embodiment uses negative photoresist. Therefore, the photoresist developing operation removes the non-exposed portions of the photoresist. Other embodiments use positive photoresist. In such embodiments, the opaque areas 31 and the clear areas 32 of the second optical mask 30 are interchanged.

Figure 5G:
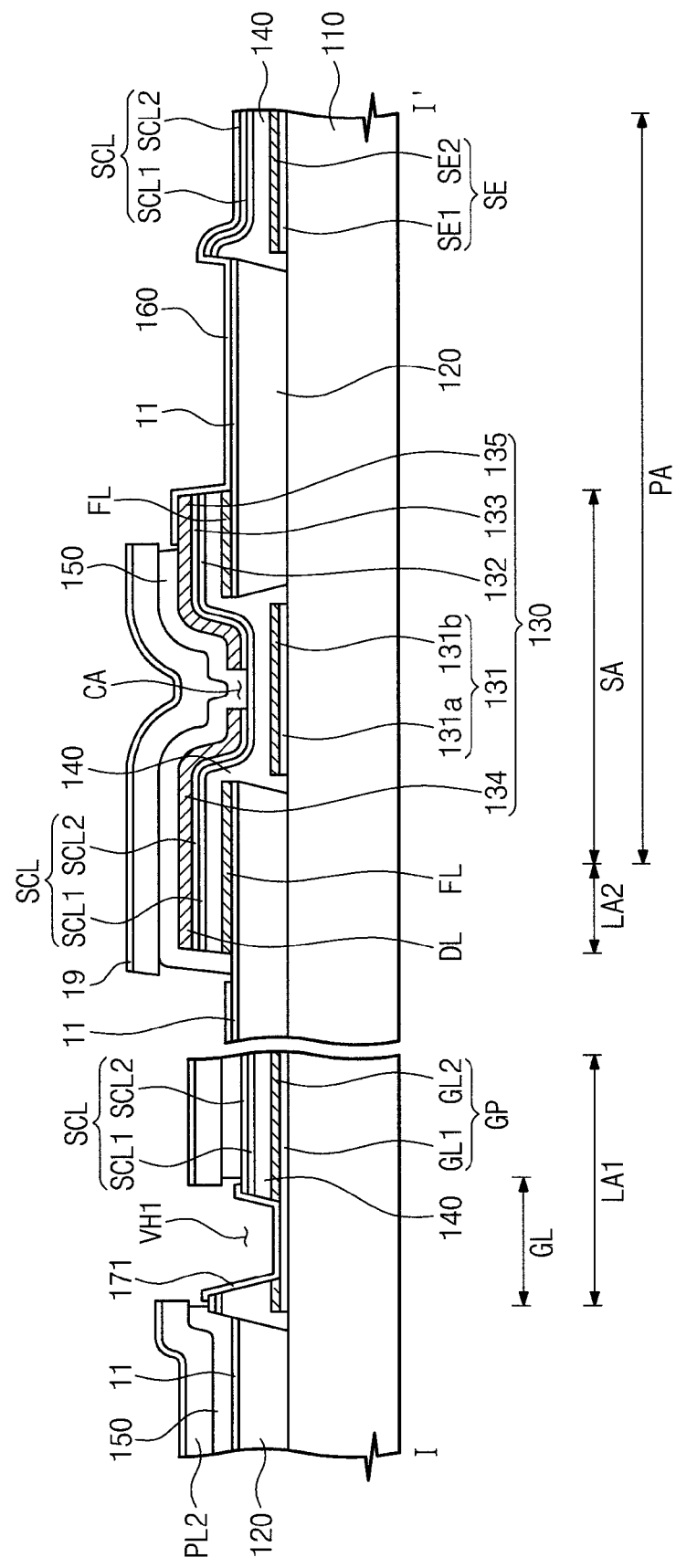

Referring to FIGS. 2 and 5G, the exposed portions of the protective layer 150 are etched away using the second masking layer PL2 as a mask. The remaining portions of the protective layer 150 cover the channel area CA, the source electrode 134, and part of the drain electrode 135. The etching removes the protective layer 150 from over the gate pad GP and the data pad DP. The protective layer 150 is over-etched in this etch.

Then a fourth metal layer 19 is deposited over the base substrate 110. Portions of the fourth metal layer 19 which are located on the second masking layer PL2 are electrically insulated from portions of the fourth metal layer 19 which are located in the areas from which the protective layer 150 has been removed. As a result, in these latter areas, the metal layer 19 provides the pixel electrode 160 in the pixel area PA, the first electrode pad 171 on the gate pad GP, and the second electrode pad 173 on the data pad DP.

Next the second masking layer PL2 and the overlying portions of the fourth metal layer 19 are removed, thereby completing fabrication of the thin film transistor substrate 101.

As described above, the color filter layer 120 has the reverse taper shape and is used as a mask in forming the gate line GL and the gate electrode 131. Thus, the total number of masks required to manufacture the thin film transistor substrate 101 is reduced, thereby reducing the manufacturing cost and improving the productivity.

Figure 6:
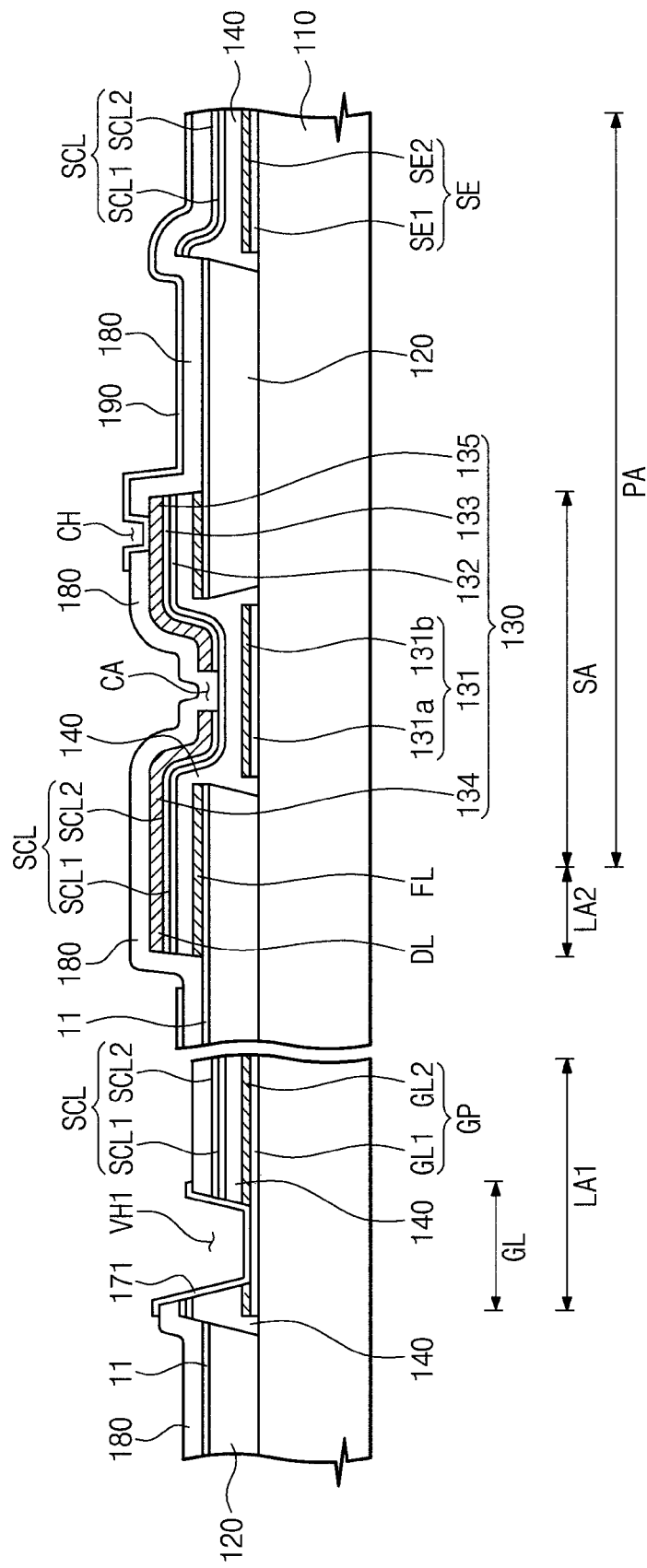
FIG. 6 is a view of a vertical cross-section of a thin film transistor substrate according to another embodiment of the present invention.

FIG. 6 is a sectional view showing a thin film transistor substrate according to another exemplary embodiment of the present invention. Thin film transistor substrate 102 of this embodiment has same structure and function as the thin film transistor substrate 101 shown in FIG. 1 except for a protective layer 180 and pixel electrode 190. Those elements of the embodiment of FIG. 6 which have the same structure and function as in the embodiment of FIG. 1 are given the same reference numerals as in FIGS. 1 and 2, and repetitive description of such elements will be avoided.

Referring to FIG. 6, the thin film transistor substrate 102 includes a base substrate 110, a color filter layer 120, a gate line GL, a data line DL, a thin film transistor 130, a protective layer 180, and a pixel electrode 190.

The protective layer 180 is formed in the first line area LA1 and the second line area LA2 of the base substrate 110 to cover the data line DL. Contact hole CH is formed in the protective layer 180. The contact hole CH exposes a portion of a drain electrode 135. Also, a first via hole VH1 is formed in the protective layer 180 over a gate pad GP, and a second via hole VH2 is formed in the protective layer 180 over a data pad DP.

The pixel electrode 190 is formed on the protective layer 180. The pixel electrode 190 is formed in the pixel area PA and electrically connected to the drain electrode 135 through the contact hole CH.

Now a method of manufacturing the thin film transistor substrate 102 will be described in detail with reference to FIGS. 7A to 7C which illustrate vertical cross sections of substrate 102 at consecutive stages of fabrication.

Figure 7B:
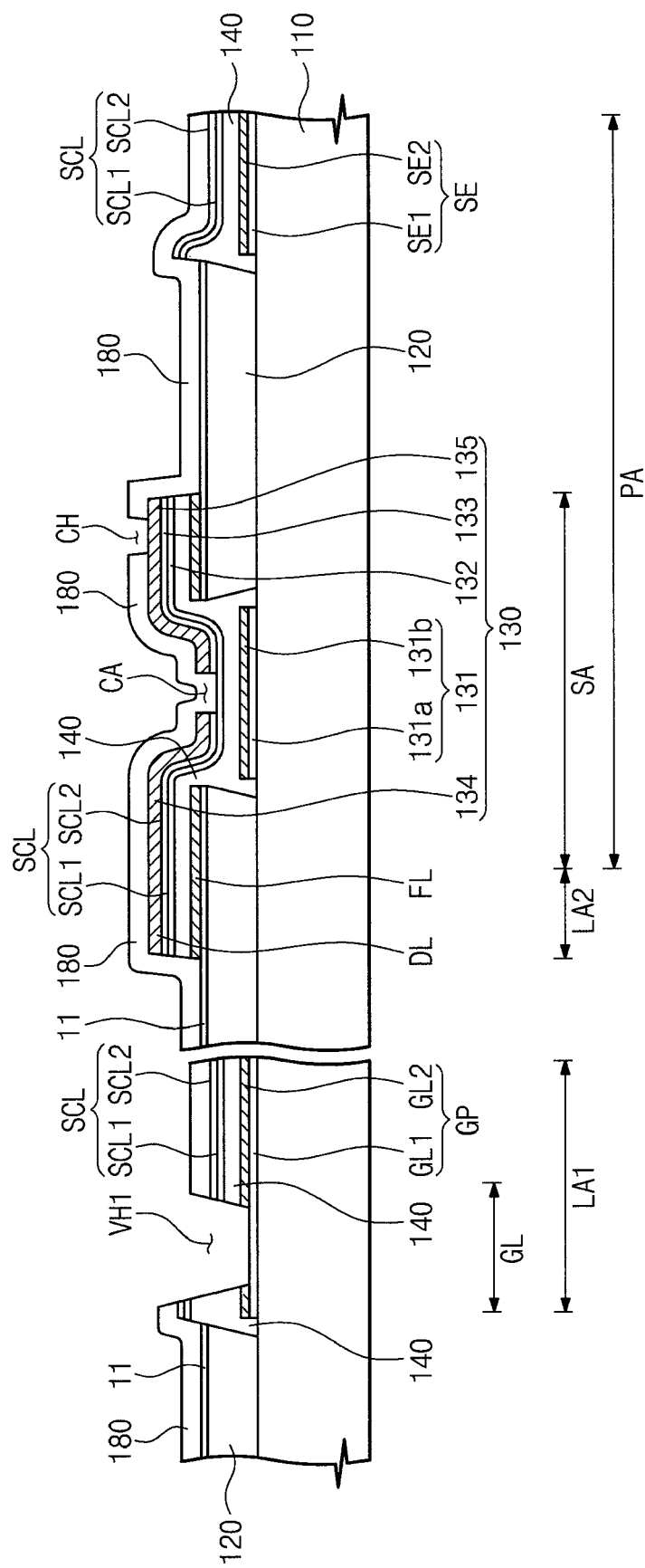

As shown in FIGS. 7A and 7B, the gate line GL, the data line DL, the floating line FL, the semiconductor line SCL, and the thin film transistor 130 are formed on the base substrate 110, possibly by the same processes as in the embodiment of FIGS. 3A to 5G.

After fabrication of the thin film transistor 130, the protective layer 180 is formed on the base substrate 110. Then the protective layer 180 is patterned to form the contact hole CH, the first via hole VH1 exposing the gate pad GP, and the second via hole VH2 exposing the data pad DP.

Referring to FIGS. 6 and 7C, the fourth metal layer 19 is formed on the protective layer 180 and patterned to provide the pixel electrode 190 and also to provide first electrode pad 171 on each gate pad GP and to provide a second electrode pad 173 on the data pad DP (see FIG. 1).

Thus, in manufacturing the thin film transistor substrate, the color filter layer has the reverse taper shape to serve as a mask defining the gate line and the gate electrode. Consequently, despite having the color filter layer into the thin film transistor substrate, the total number of masks used to manufacture the thin film transistor substrate may be reduced, thereby reducing the manufacturing cost and improving the productivity.

The invention is not limited to the exemplary embodiments described above but includes other embodiments and variations as defined by the appended claims.

What is claimed is:

1. A thin film transistor substrate comprising:
   a base substrate including a pixel area having a switching area, a first line area adjacent to the pixel area, and a second line area adjacent to the pixel area and crossing the first line area;
   a color filter arranged in the pixel area except the switching area and in the second line area and having a reverse taper shape;
   a gate line arranged in the first line area and spaced apart from the color filter;
   a data line overlying the color filter in the second line area;
   a thin film transistor arranged in the switching area and electrically connected to the gate line and the data line; and
   a pixel electrode overlying the color filter and electrically connected to the thin film transistor.

2. The thin film transistor substrate of claim 1, wherein the gate line comprises a first gate line layer and a second gate line layer on the first gate line layer.

3. The thin film transistor substrate of claim 2, wherein the first gate line layer is made of a different material than the data line, and the second gate line layer is made of the same material as the data line.

4. The thin film transistor substrate of claim 3, further comprising a gate insulating layer overlying the gate line.

5. The thin film transistor substrate of claim 4, further comprising a semiconductor line overlying the gate insulating layer, wherein the thin film transistor comprises a semiconductor layer merging with the semiconductor line.

6. The thin film transistor substrate of claim 5, wherein the semiconductor layer comprises an active layer having a thickness of about 1500 angstroms to about 2500 angstroms and an ohmic contact layer having a thickness of about 400 angstroms to about 600 angstroms, the color filter has a thickness of about 10000 angstroms to about 15000 angstroms, the gate line has a thickness of about 4000 angstroms to about 5000 angstroms, and the gate insulating layer has a thickness of about 1500 angstroms to about 2500 angstroms.

7. The thin film transistor substrate of claim 4, further comprising a floating line that is arranged between the gate insulating layer and the color filter in the data line's area.

8. The thin film transistor substrate of claim 3, wherein the first gate line layer is made of the same material as the pixel electrode.

9. The thin film transistor substrate of claim 3, further comprising a protective layer overlying the data line and the thin film transistor.

10. The thin film transistor substrate of claim 9, wherein the protective layer does not overlap with the pixel electrode.

11. The thin film transistor substrate of claim 3, further comprising a protective layer covering the data line, part of the protective area being disposed under the pixel electrode, the protective layer having a contact hole formed therethrough to a portion of a drain electrode of the thin film transistor.

* * * * *